(12) United States Patent
Summers et al.

(10) Patent No.: US 11,674,989 B1
(45) Date of Patent: Jun. 13, 2023

(54) DETERMINING CAPACITANCE AND RESISTANCE-CAPACITANCE TIME CONSTANT

(71) Applicant: Cadence Design Systems, Inc., San Jose, CA (US)

(72) Inventors: Mark A. Summers, Cary, NC (US); Rajesh Babu Kunda, Kadapa (IN)

(73) Assignee: Cadence Design Systems, Inc., San Jose, CA (US)

( * ) Notice: Subject to any disclaimer, the term of this patent is extended or adjusted under 35 U.S.C. 154(b) by 313 days.

(21) Appl. No.: 17/067,347

(22) Filed: Oct. 9, 2020

(51) Int. Cl.
*G01R 27/26* (2006.01)

(52) U.S. Cl.
CPC ..... *G01R 27/2623* (2013.01); *G01R 27/2605* (2013.01)

(58) Field of Classification Search
CPC .................. G01R 27/2623; G01R 27/2605
See application file for complete search history.

*Primary Examiner* — Amy He
(74) *Attorney, Agent, or Firm* — Schwegman Lundberg & Woessner, P.A.

(57) ABSTRACT

Various embodiments provide for determining a capacitance (or capacitor value) of a circuit, determining a resistance-capacitance time constant (or RC time constant) of a circuit, or both. The circuit can comprise an integrated circuit (IC), such as a circuit implemented on die. An IC of some embodiments generates a frequency of a clock wave signal (e.g., an output signal) such that the clock wave signal encodes an effective capacitance of the IC, a RC time constant of the IC, or both. A component external to the IC, such as a controller, can receive the clock wave signal and determine the effective capacitance of the IC, the RC time constant of the IC, or both based on the received clock wave signal.

17 Claims, 15 Drawing Sheets

DETERMINING CAPACITANCE AND RESISTANCE-CAPACITANCE TIME CONSTANT

TECHNICAL FIELD

Embodiments described herein relate to circuits and, more particularly, to determining a capacitance of a circuit and determining a resistance-capacitance time constant of a circuit.

BACKGROUND

A resistance-capacitance (RC) time constant of a circuit can indicate a time value needed to charge a capacitor of the circuit through a resistor of the circuit. Generally, the RC time constant of a circuit is equal to a product of the circuit's resistor and capacitor. With respect to integrated circuits (ICs), though the capacitance and RC time constant of an IC can be known at the time of its design, process variations in manufacturing the IC can cause variations in the actual capacitance and RC time constant of the IC. Having knowledge of capacitor and RC time constant values of an IC can be useful in improving performance of the IC, as it allows for compensation of process variations.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
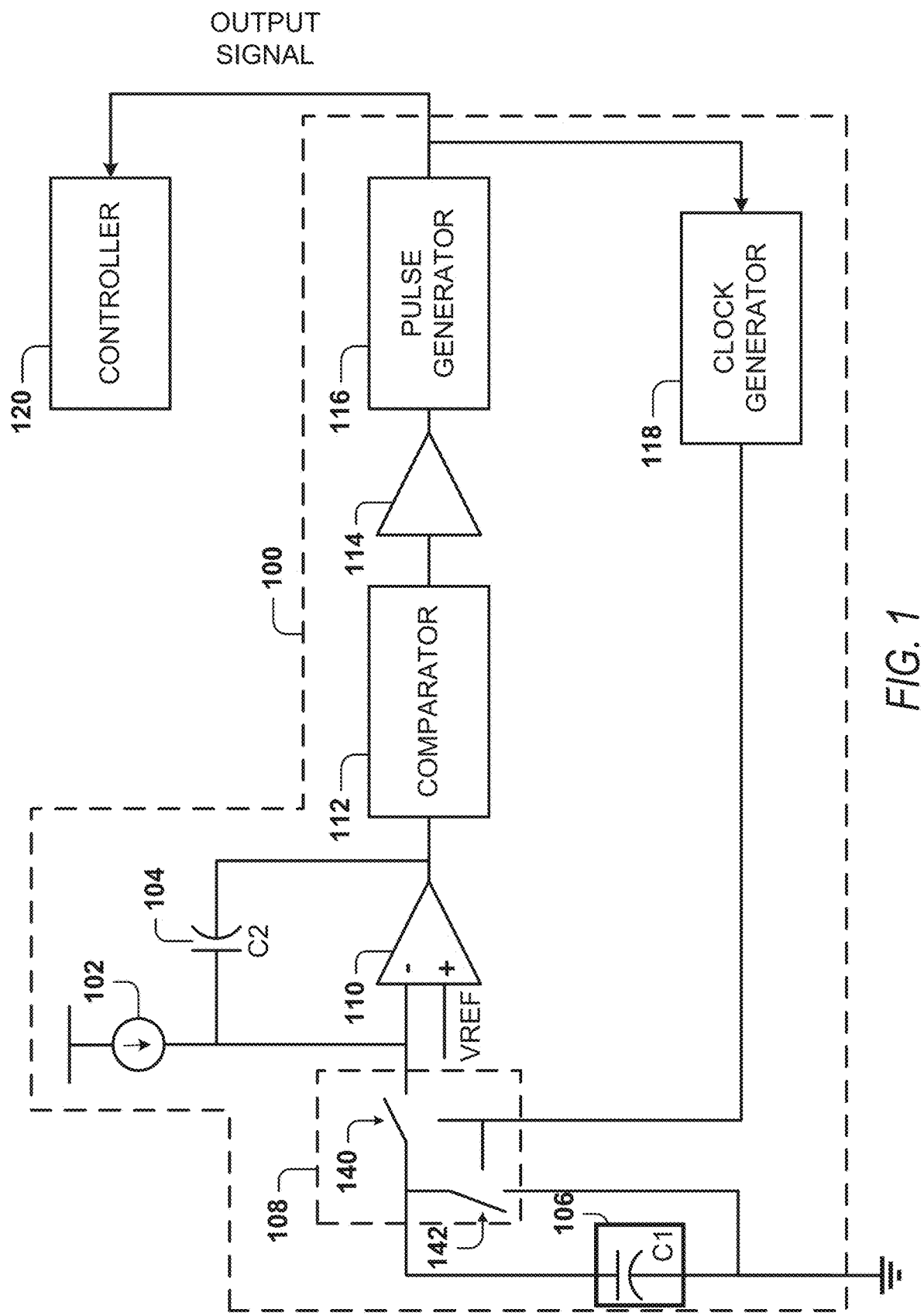
FIGS. 1 through 4 are schematics illustrating example circuits for determining an effective capacitance and a RC time constant, in accordance with various embodiments.

Various embodiments provide for determining a capacitance (or capacitor value) of a circuit, determining a resistance-capacitance time constant (or RC time constant) of a circuit, or both. The circuit can comprise an integrated circuit (IC), such as a circuit implemented on die (e.g., on-chip circuit or an IC in hardware package). Some embodiments enable an effective capacitance of one or more capacitors of an IC (e.g., on-chip capacitors) to be determined (e.g., measured). Additionally, some embodiments enable a RC time constant of one or more capacitors of an IC (e.g., on-chip capacitors) to be determined (e.g., measured). In particular, an IC of some embodiments generates a frequency of a clock wave signal (e.g., an output signal) such that the clock wave signal encodes an effective capacitance of the IC, a RC time constant of the IC, or both. For some embodiments, a component external to the IC, such as a controller, receives the clock wave signal and determines (e.g., decodes or extracts) the effective capacitance of the IC, the RC time constant of the IC, or both based on the received clock wave signal. For instance, the component can determine (e.g., extract) the effective capacitance of the IC from the clock wave signal based on measuring the clock wave signal, such as measuring the period of the clock wave signal. In another instance, the component can determine (e.g., extract) the effective capacitance of the IC from the clock wave signal based on measuring the clock wave signal and further based on a known resistor value. Additionally, the component can determine (e.g., extract) the RC time constant of the IC from the clock wave signal by comparing the clock wave signal against a reference clock signal having a known frequency. For various embodiments, determination of an effective capacitance of the IC based on a generated clock wave signal (e.g., oscillator frequency signal) and determination of a RC time constant of the IC based on the generated clock wave signal can be performed independent of each other.

By use of various embodiments, a circuit (e.g., integrated circuit) can generate a clock wave signal having a frequency that is based on capacitance of a portion of the circuit, a RC time constant of a portion of the circuit, or both, thereby enabling a component (e.g., another circuit) external to the circuit that receives the clock wave signal to determine (e.g., measure) the capacitance and/or RC time constant of the circuit. Additionally, various embodiments enable the circuit to generate the clock wave signal with has low variation with temperature (e.g., on-die temperature) or voltage (e.g., on-die voltage) variation. For example, some embodiments use one or more external components, such as an external resistor or oscillator, which have low variation with temperature and voltage.

As used herein, capacitor value and capacitance are used interchangeably, and can comprise a numerical value. Additionally, as used herein, resistance-capacitance time constant can comprise a numerical value.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a schematic illustrating an example circuit 100 for determining a capacitance (or capacitor value) and a resistance-capacitance (RC) time constant of a portion 106 of the circuit 100 (hereafter, target portion 106 of the circuit 100), in accordance with various embodiments. Depending on the embodiment, the circuit 100 can form part of a larger circuit, such as a circuit for data communications (e.g., Peripheral Component Interconnect Express (PCIe) physical layer circuit). As shown, the circuit 100 comprises a current generator 102, a capacitor 104, a set of switches 108 that comprises a first switch 140 and a second switch 142, an operational amplifier 110, a comparator 112, an amplifier 114, a pulse generator 116, and a clock generator 118. As also shown, the circuit 100 is coupled to a controller 120, which can represent a component or circuit external to the circuit 100 that receives an output signal from the circuit 100 and determines capacitance, RC time constant, or both for the target portion 106 of the circuit 100 based on the received output signal. In FIG. 1, the capacitor (C1) (coupled between an negative input of the operational amplifier 110 and ground) represents one or more capacitors of the target portion 106 of the circuit 100 for which an effective capacitance, a resistance-capacitance time constant, or both are being determined in accordance with various embodiments described herein. The capacitor C1 is used merely for illustrate purposes, and it will be understood that the capacitor C1 can be replaced with another circuit comprising a configuration different from what is currently illustrated. Additionally, in FIG. 1, each of the set of switches 108 is enabled and disabled based on (e.g., is driven by) one or more clock signals generated by the clock generator 118.

With respect to various embodiments described herein, the capacitor C1 forms part of the target portion 106 of the circuit 100 (for which capacitance, RC time constant, or both are being determined), while the current generator 102, the capacitor 104, the set of switches 108, the operational amplifier 110, the comparator 112, the amplifier 114, the pulse generator 116, and the clock generator 118 form another portion of the circuit 100 configured to facilitate generation of an output signal based on at least one of an effective capacitance of the target portion 106 of the circuit 100 or a resistance-capacitance time constant for the target portion 106 of the circuit 100. For some embodiments, the circuit 100 is an integrated circuit, where both the target portion 106 and the other portion of the circuit 100 can form the integrated circuit on a single die (e.g., within an IC hardware package, such as an IC chip).

As also shown, the operational amplifier 110 comprises a negative input (negative node), a positive input (positive node), and an operational amplifier output (output node), where the positive input is coupled to a reference voltage. The current generator 102 comprises an output that is coupled to the negative input of the operational amplifier 110. The capacitor 104 is coupled between the operational amplifier output and the negative input of the operational amplifier 110. The comparator 112 is coupled to the operational amplifier output (of the operational amplifier 110), the amplifier 114 is coupled to an output of the comparator 112, and the pulse generator 116 is coupled to an output of the amplifier 114. The output of the pulse generator 116 provides an output signal, which is effectively generated based on the capacitance, the RC time constant, or both of the capacitor C 1 as described herein. For some embodiments, based on the signal generated and provided by the comparator 112, the pulse generator 116 generates the output signal such that the output signal comprises a pulse corresponding to each positive edge of the signal provided by the comparator 112. The pulse generator 116 can comprise a delay, component, which determines the width of the one or more pulses generated in the output signal (based on the signal received from the comparator 112). The clock generator 118 is coupled to the output of the pulse generator 116, which generates one or more clock signals based on the output signal and provides the one or more clock signals to the set of switches 108.

As also shown, the set of switches 108 couples the target portion 106 of the circuit 100 (for which capacitance, RC time constant, or both are being determined) to the negative input of the operational amplifier 110. In particular, the first switch 140 is selectively enabled or disabled (based on at least one clock signal provided by the clock generator 118), where the first switch 140 can couple the negative input of the operational amplifier 110 to the target portion 106 of the circuit 100 when the first switch 140 is enabled (e.g., ON or active) and decouple the target portion 106 from the negative input when the first switch 140 is disabled (e.g., OFF or nonactive). The second switch 142 is also selectively enabled or disabled (based on at least one clock signal provided by the clock generator 118), where the second switch 142 can couple the capacitor C1 to ground when the second switch 142 is enabled (e.g., ON) and decouple the capacitor C1 from ground when the second switch 142 is disabled (e.g., OFF). For some embodiments, the first switch 140 and the second switch 142 are configured to enable and disable (based on at least one clock signal from the clock generator 118) such that current from the output of the current generator 102 is never shorted to ground via the target portion 106 of circuit 100 (for which capacitance, RC time constant, or both are being determined as described herein). For instance, the first switch 140 and the second switch 142 can be configured such that neither is enabled at the same time.

According to various embodiments, the output signal generated by the pulse generator 116 is based on at least one of an effective capacitance of the target portion 106 of the circuit 100 or a resistance-capacitance time constant for the target portion 106 of the circuit 100. In this way, the output signal can encode at least one of the effective capacitance of the target portion 106 of the circuit 100 or the resistance-capacitance time constant for the target portion 106 of the circuit 100. For some embodiments, the controller 120 is configured to receive the output signal from the pulse generator 116 and determine, based on the received output signal, the effective capacitance of the target portion 106 of the circuit 100, the resistance-capacitance time constant for the target portion 106 of the circuit 100, or both. In doing so, the controller 120 can effectively decode or extract the effective capacitance of the target portion 106 of the circuit 100, the resistance-capacitance time constant for the target portion 106 of the circuit 100, or both from the received output signal.

Figure 11:
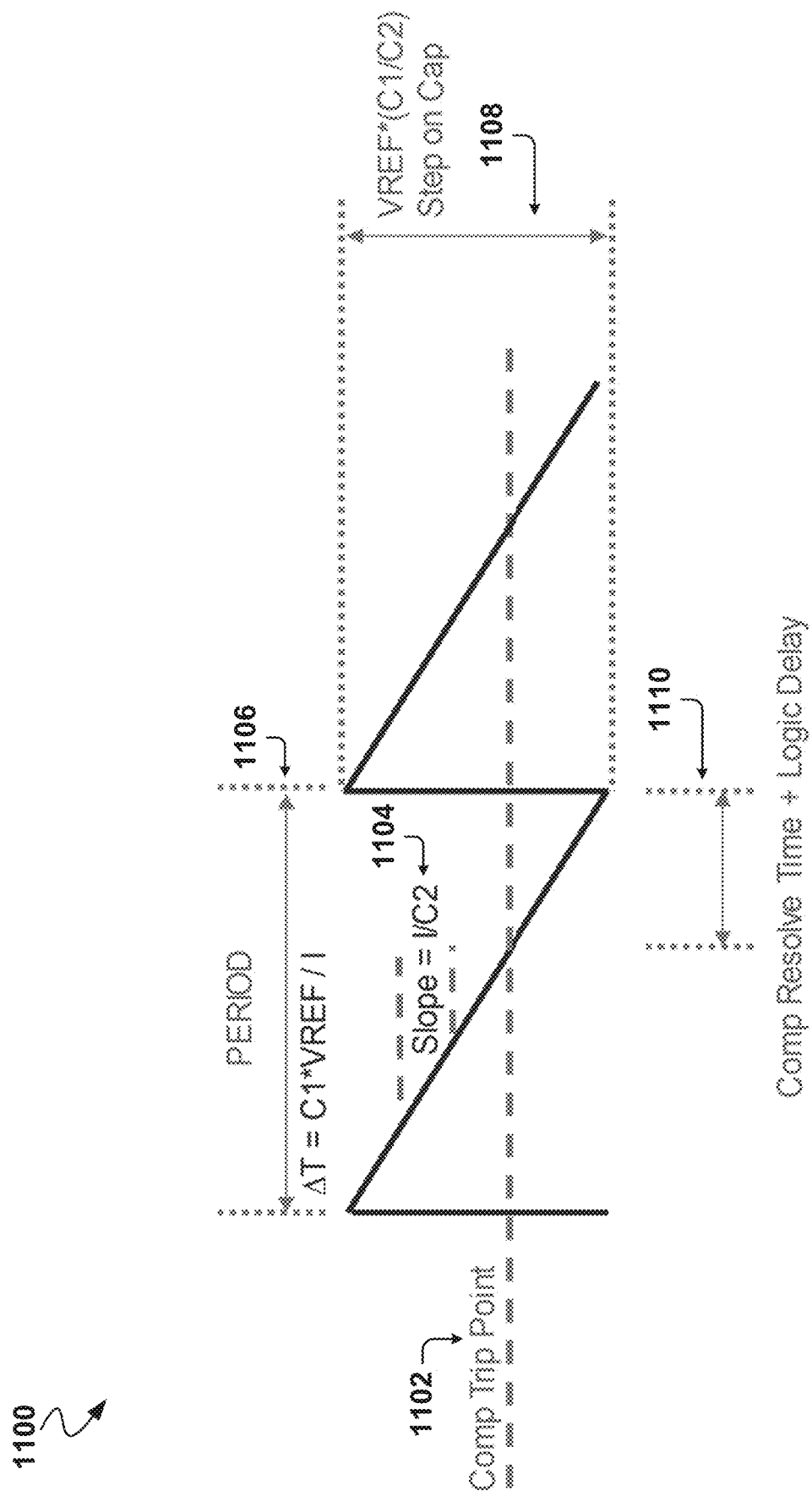
FIG. 11 is a chart illustrating an example output signal generated, in accordance with various embodiments, by a first portion of a circuit based on a capacitor and RC time constant of a second portion of the circuit.

An example output signal comprising a waveform generated by the amplifier 110 (and received by the pulse generator 116) is illustrated by FIG. 11. The pulse generator 116 can generate a series of narrow pulses that correspond to vertical wave sections of the waveform provided by the amplifier 110.

With respect to determining the effective capacitance of the target portion 106 of the circuit 100, the controller 120 can measure the output signal provided by the output of the pulse generator 116 (e.g., measure the period of the output signal), and determine an effective capacitance of the target portion 106 of the circuit 100 based on the measuring the output signal. Additionally, the determining the effective capacitance of the target portion 106 of the circuit 100 can be further based on a known resistor value. For instance, the known resistor value can match a resistor value of the current generator 102, where the resistor value is associated with a resistor used by the current generator 102 to generate current. The resistor used by the current generator 102 can form part of the current generator 102 or can be external to the current generator 102 (e.g., external to the circuit 100). For some embodiments, prior to the controller 120 determining the effective capacitance of the target portion 106 of the circuit 100, the controller 120 causes the resistor value of the current generator 102 to match a resistor being used by the controller 120, where the resistor being used by the controller 120 is external to the circuit 100 (e.g., part of the controller 120) and has the known resistor value.

With respect to determining the resistance-capacitance time constant for the target portion 106 of the circuit 100, the controller 120 can compare the output signal to a reference clock signal that has a known frequency, and determine a resistance-capacitance time constant for the target portion 106 of the circuit 100 based on the comparing the output signal to the reference clock signal.

For some embodiments, the clock generator 118 generates a first clock signal for the first switch 140 and a second clock signal for the second switch 142. For instance, the first clock signal and the second clock signal are generated by the clock generator 118 such that the first and second clock signals do not overlap (e.g., have non-overlapping phases). By generating the first and second clock signals as non-overlapping clock signals, various embodiments can ensure that the first switch 140 and the second switch 142 are not enabled at the same time, which can avoid the current generator 102 from being grounded. For instance, the first switch 140 and the second switch 142 are enabled and disabled in alternating manner. According to some embodiments, the clock generator 118 comprises a non-overlapping clock generator. Alternatively, for some embodiments, the first switch 140 and the second switch 142 are enabled and disabled based on a single clock signal generated by the clock generator 118.

During operation, the operational amplifier 110 can force the negative input and the positive input (coupled to a reference voltage, VREF) to match each other. A constant current I from the current generator 102 can be applied to the negative input of the operational amplifier 110. For some embodiments, the capacitor C1 is reset to ground (e.g., placed in a reset state or reset mode after an edge of the output signal) via the second switch 142 (e.g., by causing the second switch 142 to be enabled and the first switch 140 to be disabled). When the capacitor C1 is reset to ground via the second switch 142, based on the capacitor 104 (C2), the output voltage of the operational amplifier 110 is shifted down at a rate of I/C2. For some embodiments, the capacitor C1 is switched to the negative input of the operational amplifier 110 via the first switch 140 (e.g., by causing the first switch 140 to be enabled and the second switch 142 to be disabled). When the capacitor C1 is switched to the negative input of the operational amplifier 110 via the first switch 140, based on the capacitor 104 (C2) and the capacitor C1, the output voltage of the operational amplifier 110 is shifted up by VREF*(C1/C2).

For some embodiments, the current from the current generator 102 to the negative input of the operational amplifier 110 is never switched off, thereby allowing the output of the operational amplifier 110 to be pulled down while the reset logic (for resetting the capacitor C1 to ground) is being resolved. In this way, the output of the operational amplifier 110 can swing equal to VREF*(C1/C2). For various embodiments, the time for this cycle where the output of the operational amplifier 110 swings is equal to ΔT=(C2*VREF*C1/C2)/I=C1*VREF/I, which defines the period for the output signal eventually outputted by the pulse generator 116.

For some embodiments, the reset logic for the capacitor C1 is implemented, at least in part, by the comparator 112. The comparator 112 can operate based on a comparator trip point, which can change as the comparator 112 resolve time and logic delay time varies. In various embodiments, the comparator 112 generates a signal based on comparing a reference voltage level to a signal generated and provided by the output of the operational amplifier 110, while the output reset voltage step remains a constant step level of VREF*(C1/C2). This step level and the constant down slope can set the period and set the period independent of the comparator 112's resolve time and logic delay. For some embodiments, the period of the output signal (generated by the pulse generator 116) accurately measures the capacitance as long as the ratio of VREF/I is independent from supply voltage and temperature of the circuit 100.

Figure 2:
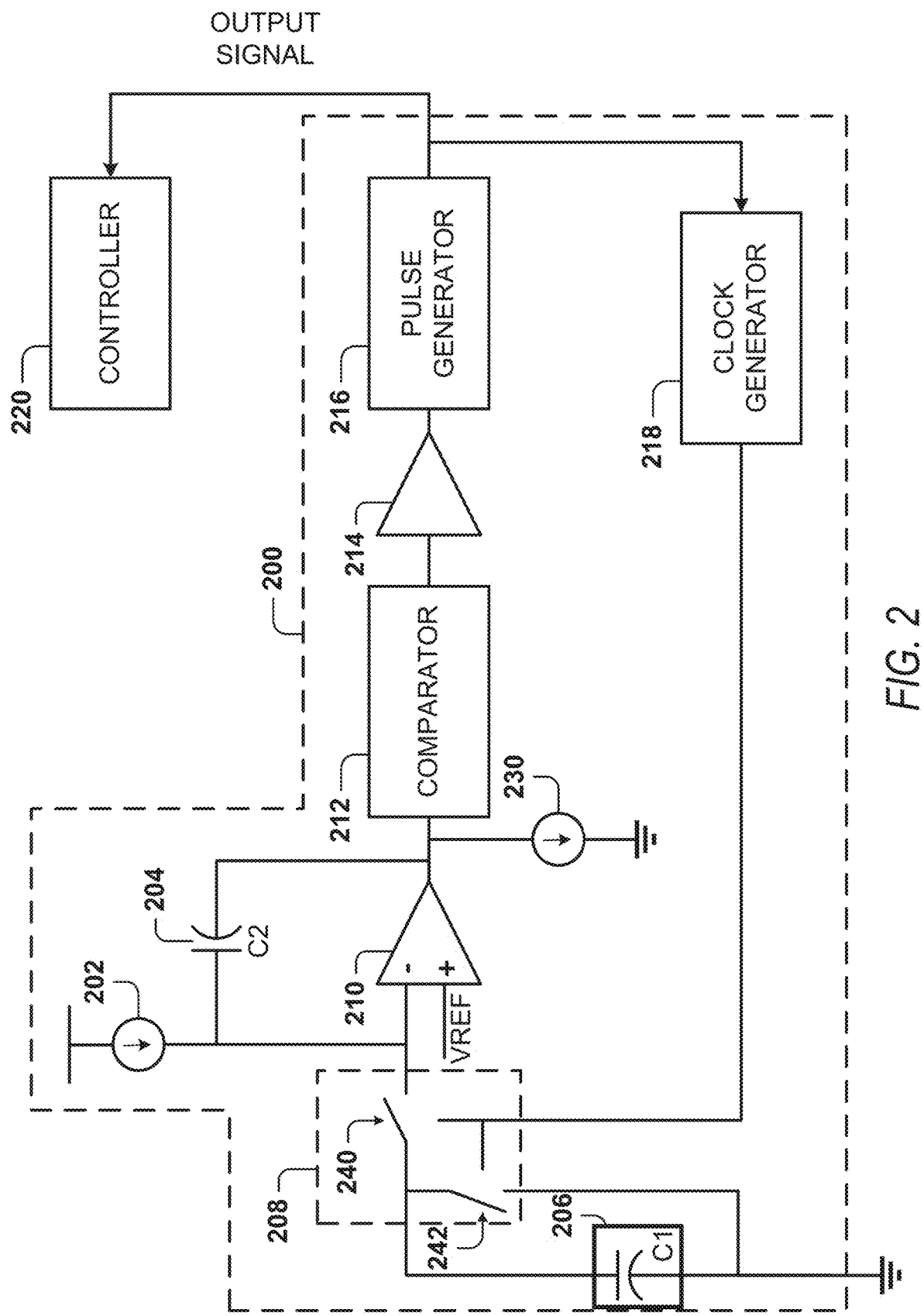

FIG. 2 is a schematic illustrating an example circuit 200 for determining an effective capacitance and a RC time constant of a portion 206 of the circuit 200 (hereafter, target portion 206 of the circuit 200), in accordance with various embodiments. As shown, the circuit 200 comprises a current generator 202, a capacitor 204, a set of switches 208 that comprises a first switch 240 and a second switch 242, an operational amplifier 210, a comparator 212, an amplifier 214, a pulse generator 216, and a clock generator 218. As also shown, the circuit 200 is coupled to a controller 220, which can represent a component or circuit external to the circuit 200 that receives an output signal from the circuit 200 and determines capacitance, RC time constant, or both for a target portion of the circuit 200 based on the received output signal. In FIG. 2, the capacitor C1 (coupled between a negative input of the operational amplifier 210 and ground) represents one or more capacitors of the target portion 206 of the circuit 200 for which capacitance, a resistance-capacitance time constant, or both are being determined in accordance with various embodiments described herein. The capacitor C1 of the portion 206 is used merely for illustrative purposes, and it will be understood that the portion 206 can be replaced with one or more other circuit elements that have a configuration different from what is currently illustrated. Additionally, in FIG. 2, each of the set of switches 208 is enabled and disabled based on is driven by) one or more clock signals generated by the clock generator 218.

According to some embodiments, the circuit 200 is similar to the circuit 100 described with respect to FIG. 1, where the current generator 202, the capacitor 204, the set of switches 208, the operational amplifier 210, the comparator 212, the amplifier 214, the pulse generator 216, and the clock generator 218 are respectively similar to the current generator 102, the capacitor 104, the set of switches 108, the operational amplifier 110, the comparator 112, the amplifier 114, the pulse generator 116, and the clock generator 118 of the circuit 100 of FIG. 1.

For some embodiments, the circuit 200 represents a variation of the circuit 100 described with respect to FIG. 1 that comprises an additional current generator 230 coupled to the output of the operational amplifier 210. The additional current generator 230 can enable the operational amplifier 210 to pull current from the capacitor 204 (C2) reliably (e.g., with minimal error, as input error is related to gain of the operational amplifier 210 [$I_{AMP}=V_{ERR}$*gain]), which can lower or prevent frequency variation based on temperature and voltage variations. For example, according to some embodiments, the additional current generator 230 pulls a constant current I from the output of the operational amplifier 210, which can provide a constant current sink to the operational amplifier 210. The additional current generator 230 pulling a constant current I from the output of the operational amplifier 210 can also effectively boost a gain of the operational amplifier 210 (e.g., boost gain by 10 times), as the operational amplifier 210 would provide current to compensate for the mismatch between current sources. Increased gain of the operational amplifier 210 can reduce variation of the frequency of the operational amplifier 210 as the gain changes over frequency.

Figure 3:
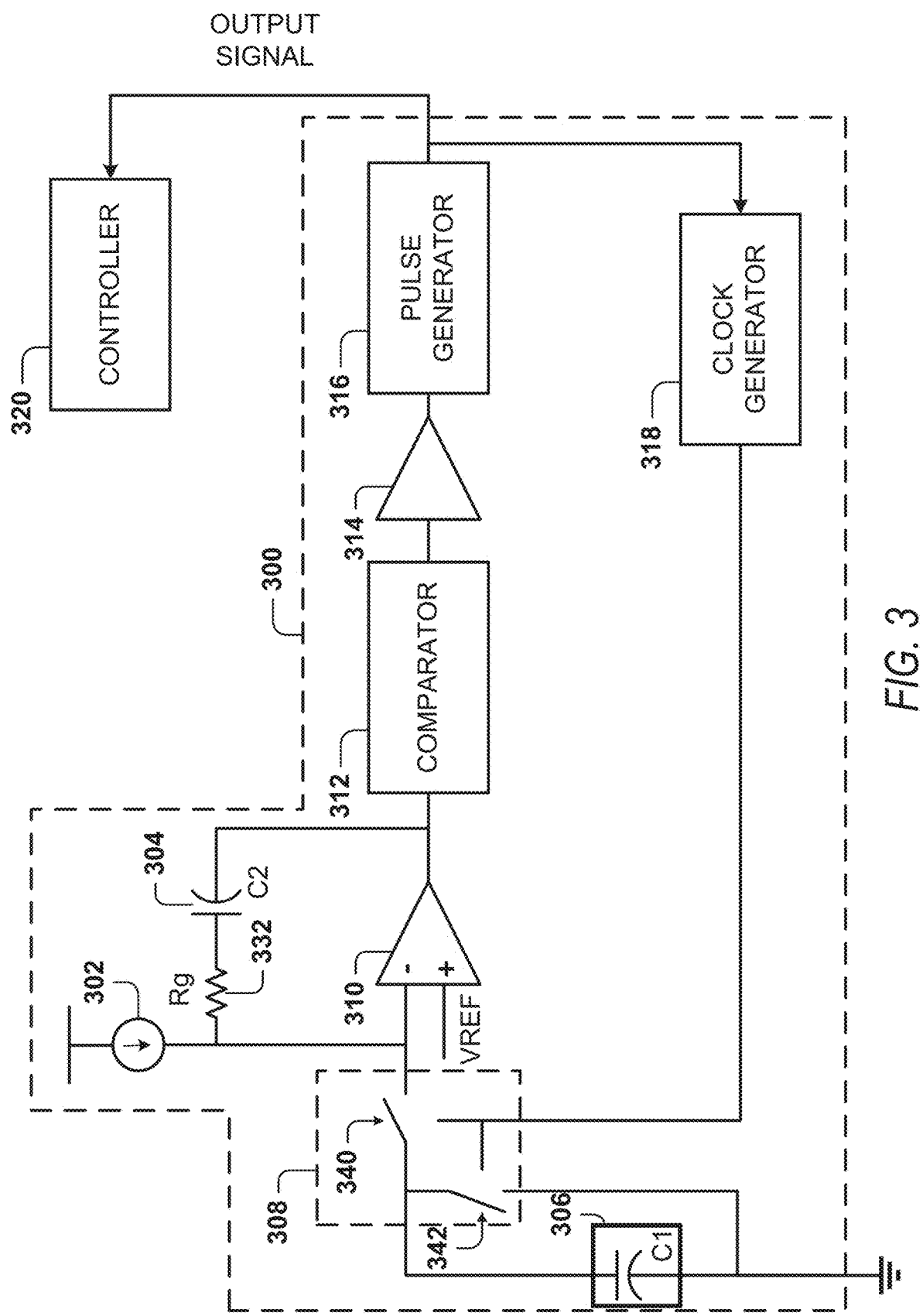

FIG. 3 is a schematic illustrating an example circuit 300 for determining an effective capacitance and a RC time constant of a portion 306 of the circuit 300 (hereafter, target portion 306 of the circuit 300), in accordance with various embodiments. As shown, the circuit 300 comprises a current generator 302, a capacitor 304, a set of switches 308 that comprises a first switch 340 and a second switch 342, an operational amplifier 310, a comparator 312, an amplifier 314, a pulse generator 316, and a dock generator 318. As also shown, the circuit 300 is coupled to a controller 320, which can represent a component or circuit external to the circuit 300 that receives an output signal from the circuit 300 and determines capacitance, RC time constant, or both for a target portion 306 of the circuit 300 based on the received output signal. In FIG. 3, the capacitor C1 (coupled between a negative input of the operational amplifier 310 and ground) represents one or more capacitors of the target portion 306 of the circuit 300 for which capacitance, a resistance-capacitance time constant, or both are being determined in accordance with various embodiments described herein. The capacitor C1 of the portion 306 is used merely for illustrate purposes, and it will be understood that portion 306 can be replaced with one or more other circuit elements that have a configuration different from what is currently illustrated. Additionally, in FIG. 3, each of the set of switches 308 is enabled and disabled based on (e.g., is driven by) one or more clock signals generated by the clock generator 318.

According to some embodiments, the circuit 300 is similar to the circuit 100 described with respect to FIG. 1, where the current generator 302, the capacitor 304, the set of switches 308, the operational amplifier 310, the comparator 312, the amplifier 314, the pulse generator 316, and the clock generator 318 are respectively similar to the current generator 102, the capacitor 104, the set of switches 108, the operational amplifier 110, the comparator 112, the amplifier 114, the pulse generator 116, and the clock generator 118 of the circuit 100 of FIG. 1.

For some embodiments, the circuit 300 represents a variation of the circuit 100 described with respect to FIG. 1 that comprises an additional resistor 332 (Rg) coupled between the capacitor 304 and the negative input of the operational amplifier 310. According to some embodiments, the operational amplifier 310 outputs enough charge to the capacitor 304 (C2) to generate a voltage step of VREF*(C1/C2). In various embodiments, the additional resistor 332 assists slewing of the output voltage step of the operational amplifier 310, where the additional resistor 332 (Rg) can provide a near instantaneous step as the current flows through the additional resistor 332 (Rg). Additionally, for some embodiments, the additional resistor 332 (Rg) reduces overshoot of the output voltage step of the operational amplifier 310, as the additional resistor 332 (Rg) can limit the step at the negative input of the operational amplifier 310 based on RC filtering.

Figure 4:
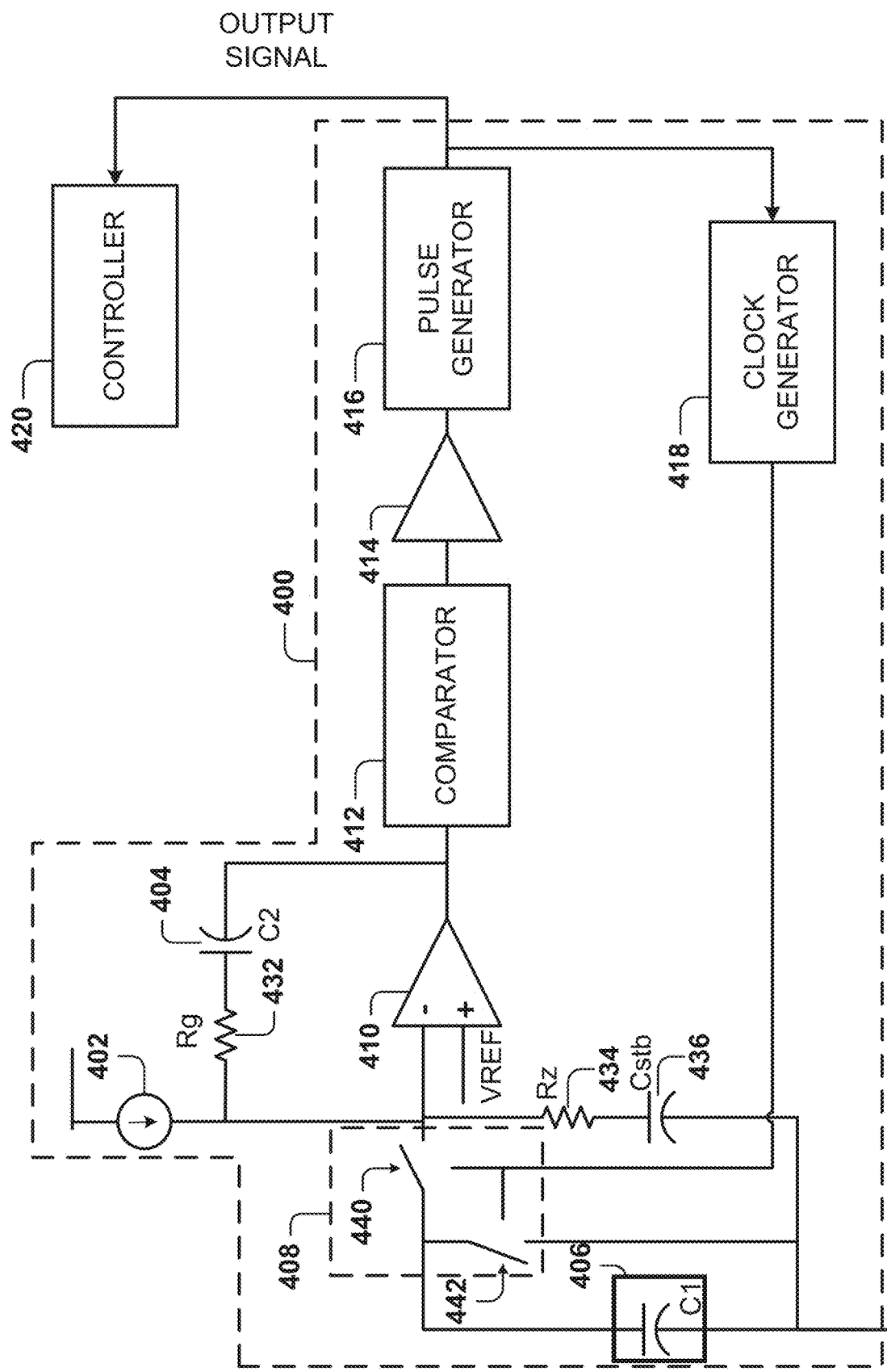

FIG. 4 is a schematic illustrating an example circuit 400 for determining an effective capacitance and a RC time constant of a portion 406 of the circuit 400 (hereafter, target portion 406 of the circuit 400), in accordance with various embodiments. As shown, the circuit 400 comprises a current generator 402, a capacitor 404, a set of switches 408 that comprises a first switch 440 and a second switch 442, an operational amplifier 410, a comparator 412, an amplifier 414, a pulse generator 416, a clock generator 418, and a resistor 432. As also shown, the circuit 400 is coupled to a controller 420, which can represent a component or circuit external to the circuit 400 that receives an output signal from the circuit 400 and determines capacitance, RC time constant, or both for a target portion 406 of the circuit 400 based on the received output signal. In FIG. 4, the capacitor C1 (coupled between a negative input of the operational amplifier 410 and ground) represents one or more capacitors of the target portion 406 of the circuit 400 for which capacitance, a resistance-capacitance time constant, or both are being determined in accordance with various embodiments described herein. The capacitor C1 of the portion 406 is used merely for illustrative purposes, and it will be understood that portion 406 can be replaced with one or more other circuit elements that have a configuration different from what is currently illustrated. Additionally, in FIG. 4, each of the set of switches 408 is enabled and disabled based on (e.g., is driven by) one or more clock signals generated by the clock generator 418.

According to some embodiments, the circuit 400 is similar to the circuit 400 described with respect to FIG. 4, where the current generator 402, the capacitor 404, the set of switches 408, the operational amplifier 410, the comparator 412, the amplifier 414, the pulse generator 416, the clock generator 418, and the resistor 432 are respectively similar to the current generator 302, the capacitor 304, the set of switches 308, the operational amplifier 310, the comparator 312, the amplifier 314, the pulse generator 316, the clock generator 318, and the additional resistor 332 of the circuit 300 of FIG. 3.

For some embodiments, the circuit 400 represents a variation of the circuit 400 described with respect to FIG. 4 that comprises an additional resistor 434 (Rz) and an additional capacitor 436 (Cstb) coupled in series, where the series is coupled between the negative input of the operational amplifier 410 and ground. According to some embodiments, a feedback factor for the operational amplifier 410 is equal to C2/(C1+C2) when the capacitor C1 is coupled to the negative input of the operational amplifier 410 via the first switch 440 (e.g., when the first switch 440 is enabled), and the capacitor C1 is in reset mode when the capacitor C1 is decoupled from the negative input of the operational amplifier 410 via the first switch 440 (e.g., when the first switch 440 is disabled), which can lead to a feedback factor of one to the operational amplifier 410 and lead to instability when the capacitor C1 is in reset mode. For some embodiments, the additional resistor 434 (Rz) and the additional capacitor 436 (Cstb) provide stabilization to the circuit 400 while the capacitor C1 is in reset mode. In particular, the additional resistor 434 (Rz) and the additional capacitor 436 (Cstb) can reduce the feedback factor to the operational amplifier 410 at low frequencies. At high frequencies, the additional resistor 434 (Rz) can limit the degradation of the feedback factor. In this way, this allows the loop of the capacitor C1 via the second switch 442 to maintain stability while also maintaining enough bandwidth to track the output signal and slew step of the operational amplifier 410.

Figure 5:
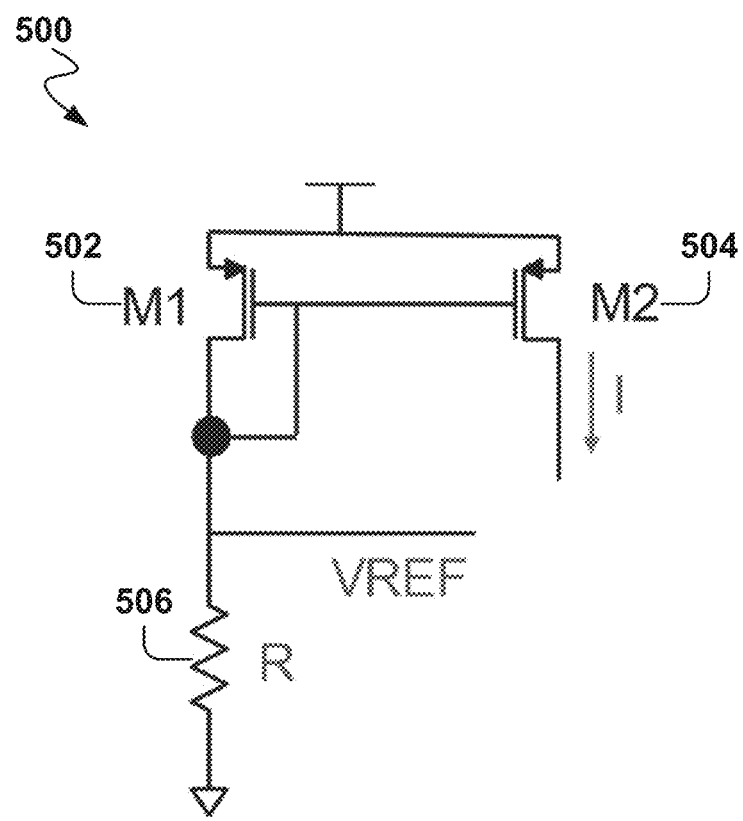
FIG. 5 is a schematic illustrating a circuit of an example current generator used by various embodiments.

FIG. 5 is a schematic illustrating a circuit 500 of an example current generator used by various embodiments. For some embodiments, the circuit 500 is used as the current generator 102 in the circuit 100 of FIG. 1. As shown, the circuit 500 comprises transistors 502 (M1), 504 (M2) and a resistor 506. For some embodiments, the each of the transistors 502, 504 comprises MOSFET devices. In FIG. 5, the drain of each of the transistors 502, 504 is coupled to a power source, the gates of the transistors 502, 504 are coupled together, the gate of the transistor 502 is coupled to the source of the transistor 502, and the source of the transistor 504 provides a current output of the current generator. Additionally, a reference voltage (VREF) is coupled to the source of the transistor 502, and the resistor 506 is coupled between the source of the transistor 502 and ground. Depending on the embodiment, the resistor 506 can represent a resistor that forms part of a current generator, or one that is external to the current generator. The current I outputted by the current generator (via the source of the transistor 504) is equal to VREF/R, where VREF and current I track each other based on the ratio R. As temperature, voltage, or both can change, the ratio between VREF and current I can change very little due to the output impedance of the transistors 502, 504. For some embodiments, a resistor value of the resistor 506 is equal to (e.g., matches) the known resistor value that can be used by an external component (e.g., controller 120) in determining an effective capacitance based on an output signal as described herein. By using the circuit 500 as a current generator, the output signal generated by some embodiments has a period of oscillation of ΔT=C1*R, where C1 (e.g., the of the target portion 106) represents an effective capacitance (e.g., of the target portion 106) to be determined by an external component based on a generated output signal. Accordingly, the period of the output signal can depend on the R of the circuit 500 and C1.

For some embodiments, the resistor 506 can be caused to be adjusted (e.g., by the controller 120) to match a known resistor value of an external resistor used by the controller 120 in determining an effective capacitance based on a generated output signal. Depending on the embodiment, the resistor 506 can be adjusted with ground side switches, which can be caused to be enabled or disabled by the controller 120. Alternatively, as discussed herein, the resistor 506 can be a resistor external to the current generator, such as one that is external to an integrated circuit implementing an embodiment described herein.

Figure 6:
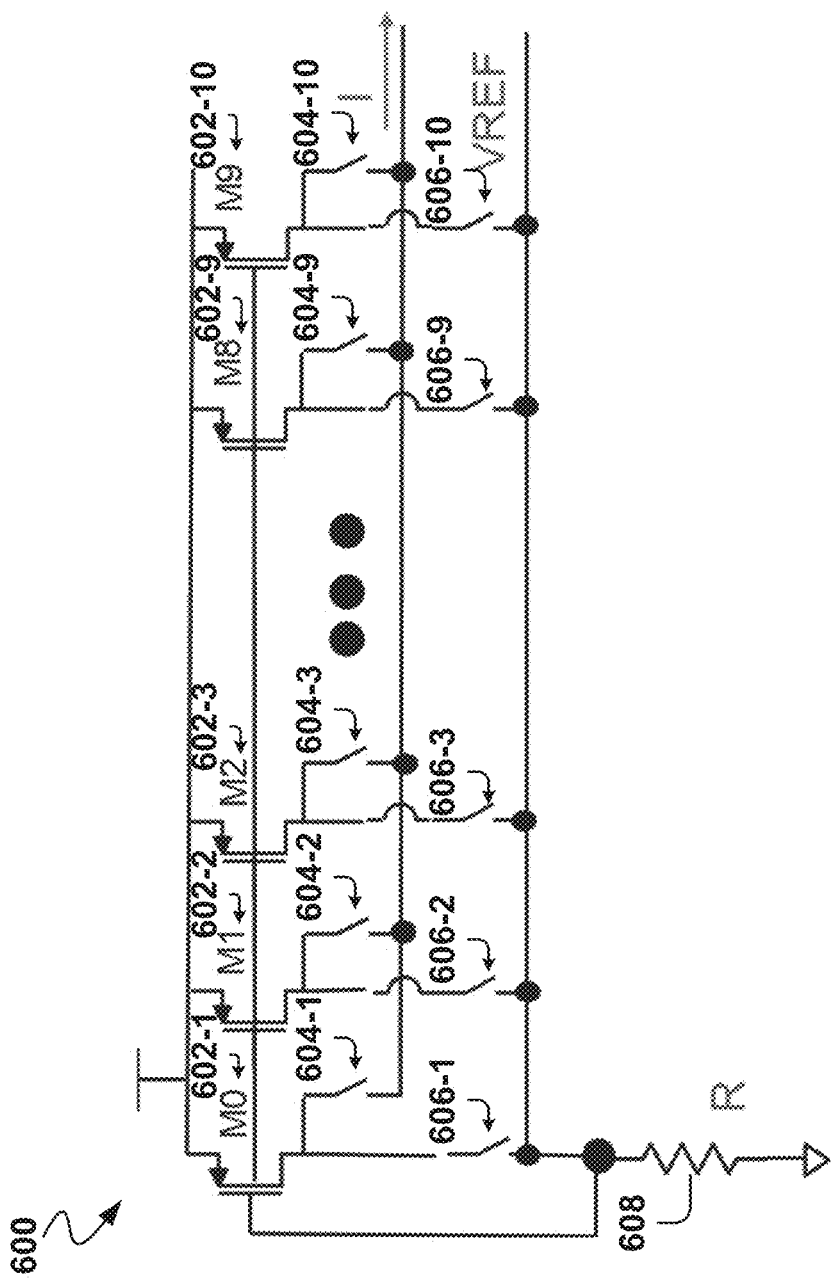
FIG. 6 is a schematic illustrating a circuit of an example current generator used by various embodiments.

FIG. 6 is a schematic illustrating a circuit 600 of an example current generator used by various embodiments. For some embodiments, the circuit 600 is used as the current generator 102 in the circuit 100 of FIG. 1. In particular, the circuit 600 represents a current generator that can be used as an alternative to the circuit 500. For some embodiments, the circuit 600 addresses a mismatch between the current that flows through the resistor 608 generating a reference voltage (VREF) and the current output of the current generator (e.g., sent to the input of an operation amplifier, such as the operational amplifier 110), thereby avoiding a shift in the frequency of the output signal.

As shown, the circuit 600 comprises a plurality of transistors 602-1 through 602-10, a first plurality of switches 604-1 through 604-10, a second plurality of switches 606-1 through 606-10, and a resistor 608. In FIG. 6, the drain of each of the transistors 602-i through 602-10 is coupled to a power source, the gate of each of the transistors 602-1 through 602-10 is coupled to the resistor 608, the source of each of the transistors 602-i through 602-10 is respectively coupled to switches 604-1 through 604-10, and the source of each of the transistors 602-1 through 602-10 is respectively coupled to switches 606-1 through 606-10. Each of the switches 604-1 through 604-10 is coupled to the current output of the current generator, and each of the switches 606-1 through 606-10 coupled to a reference voltage (VREF) and the resistor 608. Each of the transistors 602-1 through 602-10 can comprise a MOSFET device. The current generator implemented by the circuit 600 enables some embodiments to cycle through different transistors (e.g., MOSFET devices) into the current source and current mirror. In particular, the circuit 600 segments ten (10) transistors 602-i through 602-10 such that the transistors can be cycled through so that each transistor has nine (9) iterations as a current mirror device and one iteration as a current source, which can permit canceling offset/mismatch. For some embodiments that use the circuit 600 as the current generator, the external component (e.g., the controller 120) would measure the generated output signal ten times (one for each of the cycle iterations of the circuit 600).

Figure 7:
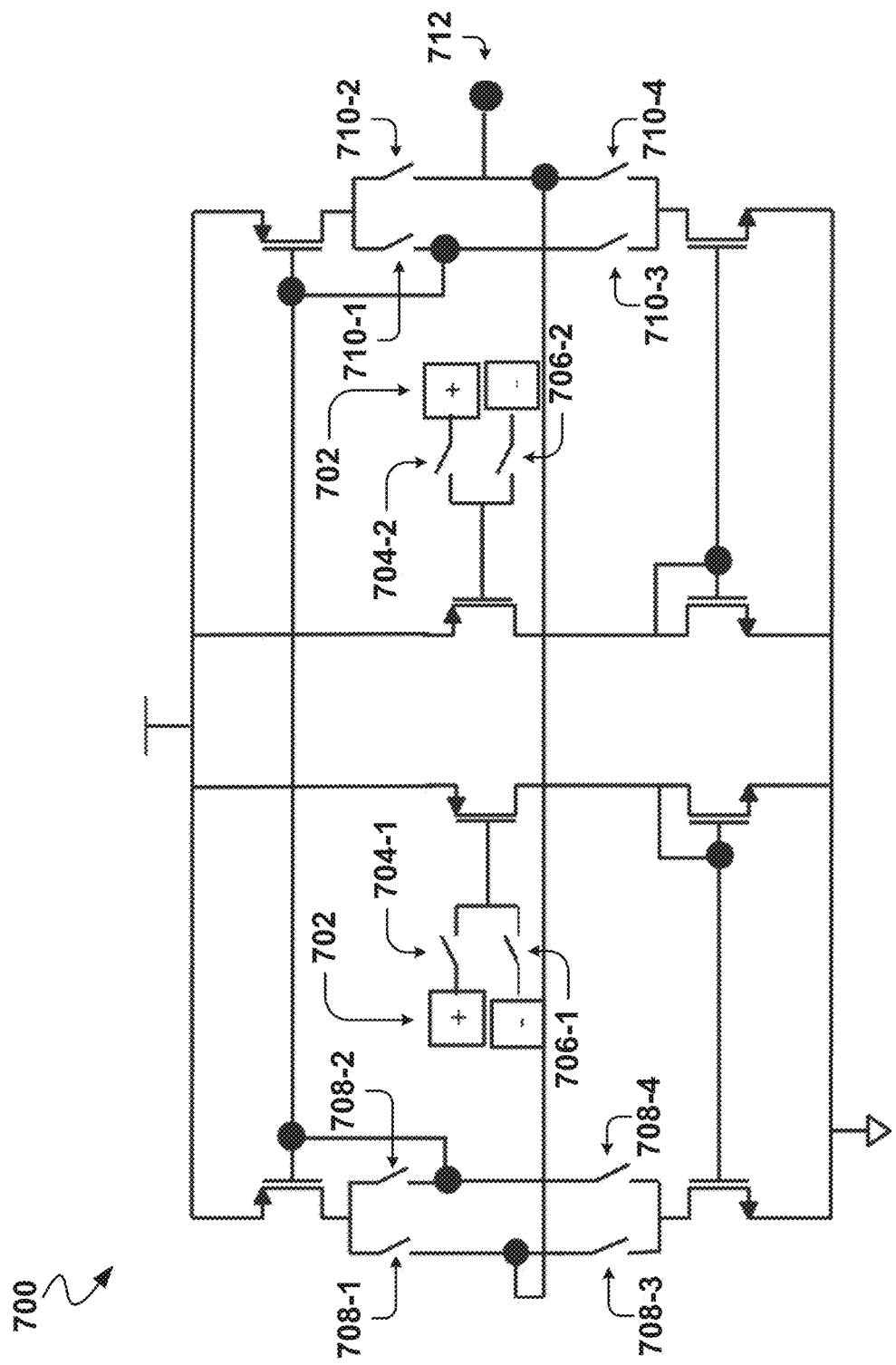
FIG. 7 is a schematic illustrating a circuit of an example operational amplifier used by various embodiments.

FIG. 7 is a schematic illustrating a circuit 700 of an example operational amplifier used by various embodiments. For some embodiments, the circuit 700 is used as the operational amplifier 110 in the circuit 100 of FIG. 1. In FIG. 7, the circuit 700 comprises an inputs 702 of the operational amplifier, switches 704, 706, 708, 710, and an output 712 (e.g., output node) of the operational amplifier. The inputs 702 comprises a positive input (e.g., positive node) and a negative input (e.g., negative node) of the operational amplifier, switches 704.

For some embodiments, the switches 704, 706, 708, 710 ensure that current flows in a particular manner during operation of the circuit 700. For example, during operation, when a first portion of the circuit 700 is connected to the positive input of the operational amplifier via the switch 704-2 (e.g., the switch 704-2 is enabled or on), the second portion of the circuit 700 is connected to the negative input of the operational amplifier via the switch 706-1 (e.g., the switch 706-1 is enabled/on), and the first portion of the circuit 700 is connected to the output 712 of the operational amplifier via the switches 710 (e.g., each of the switches 710-1, 710-2, 710-3, 710-4 is enabled/on). Additionally, when the circuit 700 is in this state, each of the switches 704-1 and 706-2 is disabled/off, and each of the switches 708-1, 708-2, 708-3, 708-4 is disabled/off to disconnect the second portion of the circuit 700 from the output 712. When the circuit 700 is in this state, in response to the positive input going up, the first portion of the circuit 700 begins to turn off and the negative input goes down, which causes the second portion of the circuit 700 begins to turn on. As a result, current flows through the second portion of the circuit 700, which increases current in the PMOS transistor of the first portion of the circuit 700 and decreases current in the NMOS transistor of the first portion of the circuit 700. This can push the voltage via the output 712 higher.

When the states of the switches 704, 706, 708, 710 are flipped, the reverse happens, and the voltage via the output 712 is pushed lower. For example, during operation, when the second portion of the circuit 700 is connected to the positive input of the operational amplifier via the switch 704-1 (e.g., the switch 704-1 is enabled or on), the first portion of the circuit 700 is connected to the negative input of the operational amplifier via the switch 706-2 (e.g., the switch 706-2 is enabled/on), and the second portion of the circuit 700 is connected to the output 712 of the operational amplifier via the switches 708 (e.g., each of the switches 708-1, 708-2, 708-3, 708-4 is enabled/on). Additionally, when the circuit 700 is in this state, each of the switches 704-2 and 706-1 is disabled/off, and each of the switches 710-1, 710-2, 710-3, 710-4 is disabled/off to disconnect the second portion of the circuit 700 from the output 712. When the circuit 700 is in this state, in response to the positive input going up, the second portion of the circuit 700 begins to turn off and the negative input goes down, which causes the first portion of the circuit 700 begins to turn on. As a result, current flows through the first portion of the circuit 700, which increases current in the PMOS transistor of the second portion of the circuit 700 and decreases current in the NMOS transistor of the second portion of the circuit 700.

According to some embodiments, the amplifier input offset of the amplifier (implemented by the circuit 700) is averaged by swapping the input pairs while also swapping the output legs in the circuit 700. In doing so, the circuit 700 inverts the offset at the input of the amplifier (e.g., the amplifier inputs and outputs are inverted on every bit change), where one run is positive offset and another run is negative offset. This can prevent the amplifier input offset from shifting the frequency of the output signal and contributing to error in measuring the capacitance and RC time constant as described herein. For some embodiments, the swap is performed over an even number of measurement cycles to cause the offset to cancel out. Additionally, for some embodiments, the amplifier offset adjustment for the circuit 700 is performed in both input/output switch states for each current source selection (e.g., with respect to the circuit 600 of the example current generator of FIG. 6). In this way, various embodiments can ensure each current source sees the same drain-to-source voltage. For example, where the current generator of an embodiment comprises the circuit 600 of FIG. 6, 20 measurements would be taken, since each of the 10 current sources will be run twice with the both positive and negative amplifier offset.

Figure 8:
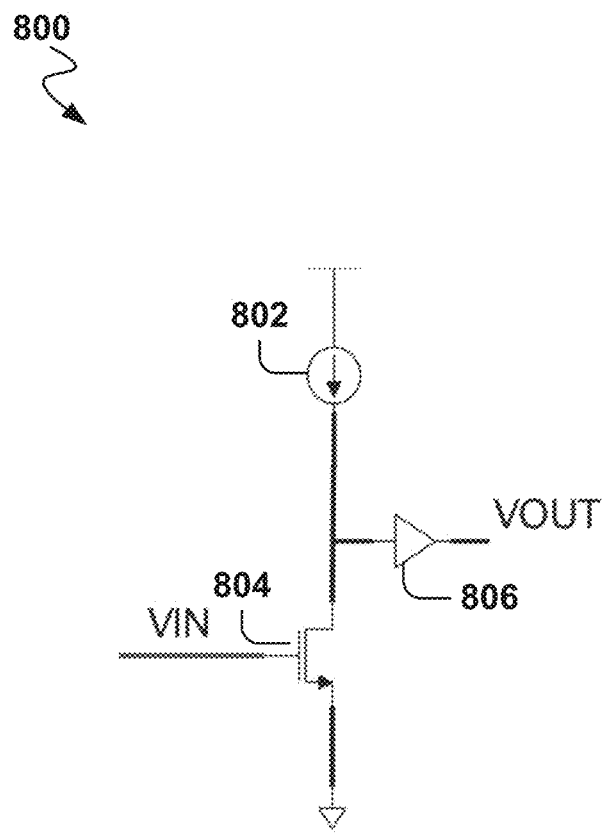
FIG. 8 is a schematic illustrating a circuit of an example comparator used by various embodiments.

FIG. 8 is a schematic illustrating a circuit 800 of an example comparator used by various embodiments. For some embodiments, the circuit 800 is used as the comparator 112 in the circuit 100 of FIG. 1. As shown, the circuit 800 comprises a current generator 802, a transistor 804, and an amplifier 806, For some embodiments, the each of the transistors 804 comprises a MOSFET device. In FIG. 8, an output of the current generator 802 is coupled to an input of the amplifier 806 and to the drain of the transistor 804. The gate of the transistor 804 is coupled to a voltage input (VIN), which can serve as an input to the comparator. The source of the transistor 804 is coupled to ground. An output of the amplifier 806 provides a voltage output (VOUT), which can serve as an output of the comparator. For various embodiments, a comparator trip point of the circuit 800 indicates point at which a voltage input to the comparator (VIN) will result in a voltage swing at the output of the comparator (VOUT). The comparator trip point of the circuit 800 can be determined by specific characteristics of the current generator 802, the transistor 804, and the amplifier 806. The resolve and delay time associated with the comparator (e.g., the circuit 800) can represent the time it takes for the comparator to respond when the voltage input traverses the comparator trip point.

For some embodiments, the circuit 800 is self-referenced with a reference voltage at or close to a voltage threshold level, where the voltage threshold level enables a good output voltage range for the amplifier 806. Though the reference voltage used can shift with temperature, this shift will not affect the period of the output signal generated by various embodiments, as the shift in reference voltage will not shift the minimum to maximum voltage at the output of the amplifier 806 (which sets the period of the output signal); the minimum to maximum voltage at the output of the amplifier 806 will shift by the same amount, keeping the peak-to-peak voltage the same.

Figure 9:
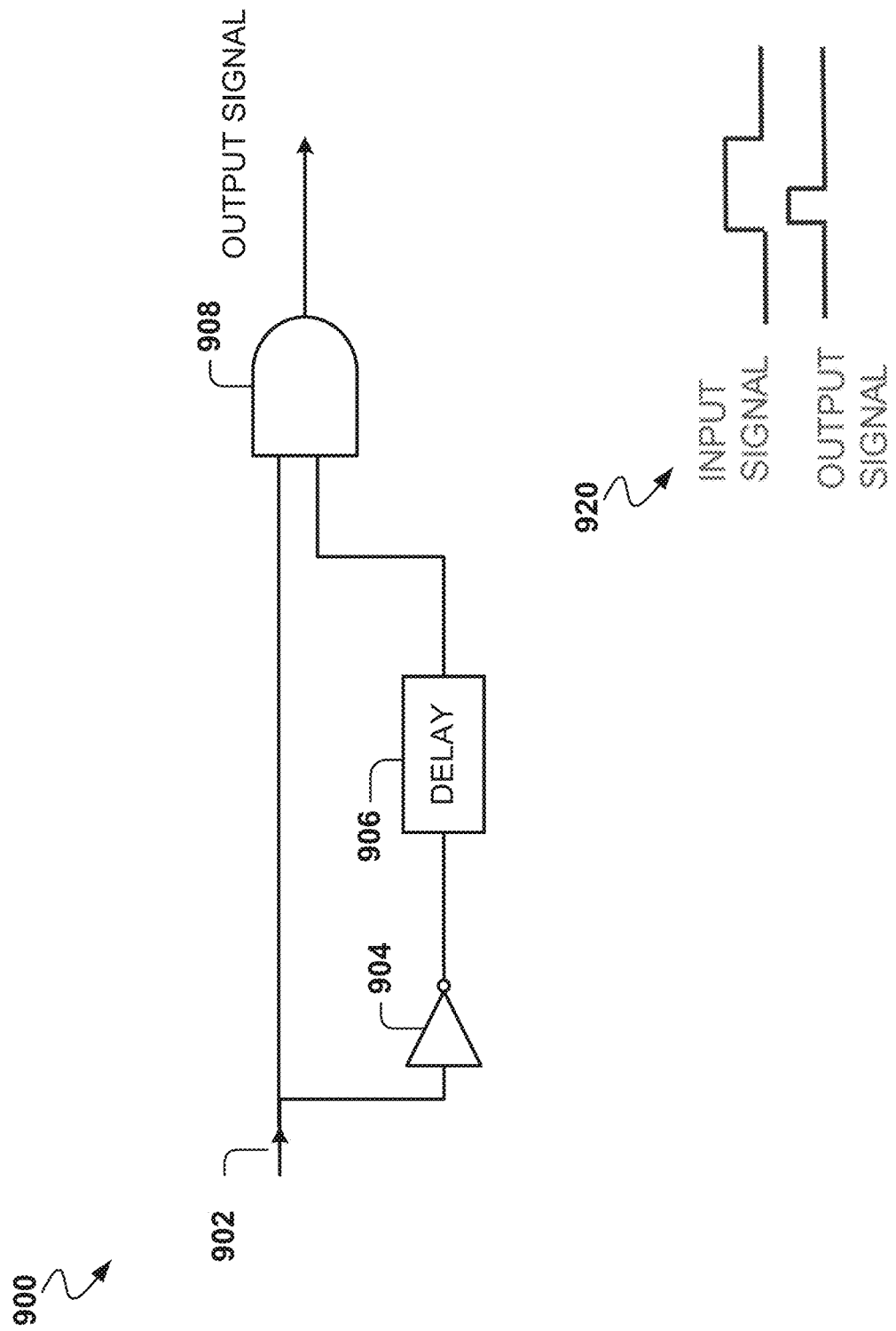
FIG. 9 is a schematic illustrating a circuit of an example pulse generator used by various embodiments.

FIG. 9 is a schematic illustrating a circuit 900 of an example pulse generator used by various embodiments. For some embodiments, the circuit 900 is used as the pulse generator 116 in the circuit 100 of FIG. 1. As shown, the circuit 900 comprises a NOT gate 904, a delay component 906, and an AND gate 908. As also shown, an input 902 of the circuit 900 is coupled to a first input of the AND gate 908, and the input 902 is coupled to an input of the NOT gate 904, which inverts the signal received via the input 902. The output of the NOT gate 904 is coupled to an input of the delay component 906, and the output of the delay component 906 is coupled to a second input of the AND gate 908. The output of the AND gate 908 provides a signal generated by the pulse generator based on a signal received at the input 902. According to some embodiments, in response to receiving a positive edge of a signal at the input 902, the circuit 900 generates a pulse having a width equal to the delay implemented by the delay component 906. For various embodiments, the pulse generated by the circuit 900 resets one or more capacitors (C1) of a portion (e.g., 106) of a circuit for which an effective capacitance, a RC time constant, or both are being determined. Diagram 920 illustrates an example of an output signal of the circuit 900 based on an input signal to the circuit 900. For some embodiments, the output duty cycle of the output signal is set by the open loop of the pulse generator (e.g., of the circuit 900).

Figure 10:
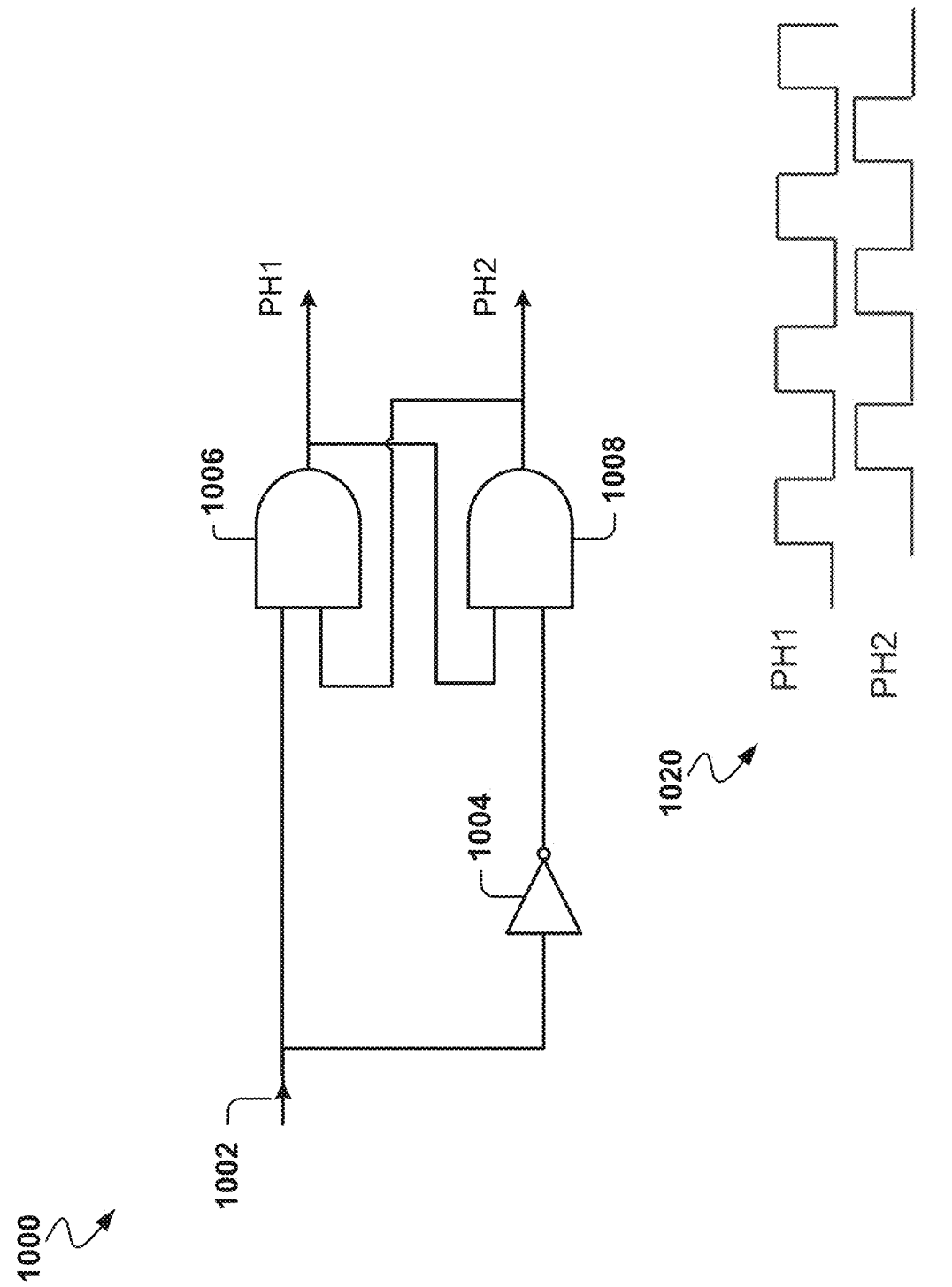
FIG. 10 is a schematic illustrating a circuit of an example clock generator used by various embodiments.

FIG. 10 is a schematic illustrating a circuit 1000 of an example dock generator used by various embodiments. For some embodiments, the circuit 1000 is used as the clock generator 118 in the circuit 100 of FIG. 1. Additionally, for some embodiments, the circuit 1000 implements a non-overlapping clock generator, where the clock signals have non-overlapping clock signals, as illustrated by diagram 1020. As shown, the circuit 1000 comprises a NOT gate 1004, a AND gate 1006, and an AND gate 1008. As also shown, an input 1002 of the circuit 1000 is coupled to a first input of the AND gate 1006, and the input 1002 is coupled to an input of the NOT gate 1004, which inverts the signal received via the input 1002. The output of the NOT gate 1004 is coupled to a first input of the AND gate 1008. The output of the AND gate 1006 is coupled to a second input of the AND gate 1008, and the output of the AND gate 1008 is coupled to a second input of the AND gate 1006. In FIG. 10, the output of the AND gate 1006 provides a first clock signal based on a signal received at the input 1002, and the output of the AND gate 1008 provides a second clock signal based on a signal received at the input 1002, where the first clock signal (PH1) and the second clock signal (PH2) have non-overlapping phases.

As described herein, for some embodiments, each switch in a set of switches (e.g., reset switches) is enabled and disabled based on at least one clock signal generated by the circuit 1000. For instance, some embodiments comprise two switches (e.g., 140 and 142 in the circuit 100), where the circuit 1000 generates a first clock signal (PH1) and a second clock signal (PH2), where one switch is enabled and disabled based on (e.g., driven by) the first clock signal, and where the other switch is enabled and disabled based on (e.g., driven by) the second clock signal. According to some embodiments, the phases of the first and second clocks are never high at the same time and, as such, the switches (e.g., 140 and 142) are never enabled (e.g., active) at the same time, which prevents a dc-path to ground for the input current.

FIG. 11 is a chart 1100 illustrating an example output signal comprising a waveform (e.g., sawtooth waveform) generated, in accordance with various embodiments, by a first portion (e.g., 106) of a circuit based on a capacitor and RC time constant of a second portion of the circuit (e.g., integrated circuit). The example waveform can be received by a pulse generator of an embodiment, which can generate a series of narrow pulses based on the waveform. As shown, the generated output signal has a period (1106) equal to C1*VREF/I, and a slope (1104) of I/C2. Once the generated output signal passes the comparator trip point 1102, a comparator of an embodiment (e.g., 112) initiates a reset of C1 to a reset mode (as described) after a resolve time and a logic delay 1110 of the comparator has passed. After C1 is in reset mode, the generated output signal is stepped up (1108) to VREF*(C1/C2) and the period of the generated output signal repeats. For some embodiments, an external component (e.g., controller 120) measures the period of the generated output signal and, based on a known resistor value (e.g., VREF/I), determines the effective capacitance (e.g., of the capacitor C1) for a portion (e.g., 106) of a circuit (e.g., 100). Additionally, for some embodiments, an external component controller 120) can compare the generated output signal to a reference clock signal having a known frequency, and determine the RC time constant based on the comparison.

Figure 12:
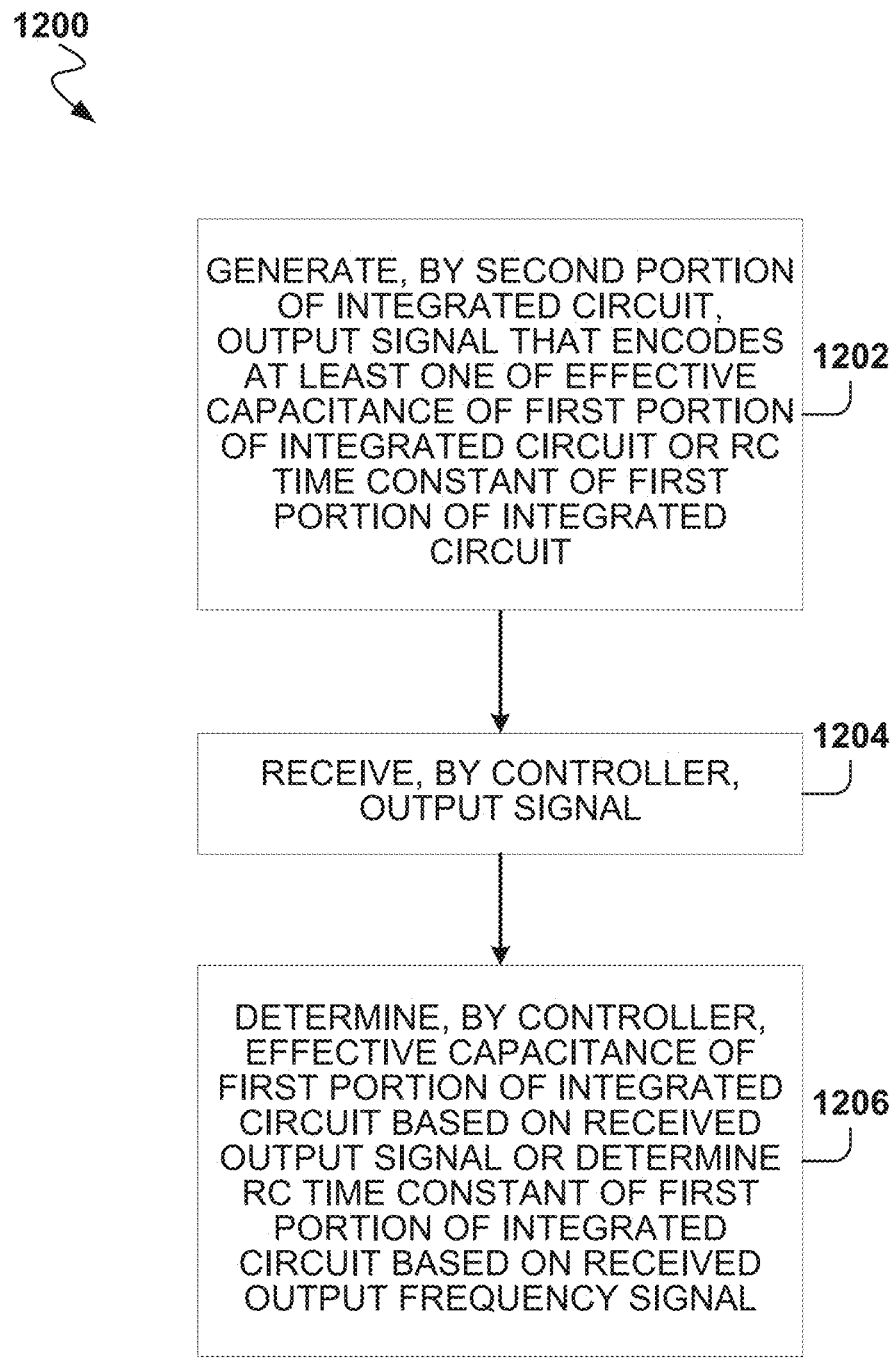
FIG. 12 is a flowchart illustrating an example method for determining capacitor-related information of a portion of a circuit, in accordance with some embodiments.

FIG. 12 is a flowchart illustrating an example method 1200 for determining capacitor-related information (e.g., an effective capacitance or RC time constant) of a portion (e.g., 106) of a circuit, in accordance with some embodiments. Some or all of the method 1200 can be performed by a circuit, such as one or more of the circuits/components described herein with respect to FIGS. 1 through 4. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 12, the method 1200 begins with operation 1202, where a second portion of an integrated circuit generates an output signal, where the output signal encodes at least one of an effective capacitance of the first portion (e.g., the target portion 106) of the integrated circuit or a resistance-capacitance (RC) time constant for the first portion (e.g., the target portion 106) of the integrated circuit. For various embodiments described herein, the first portion of the integrated circuit is coupled to the second portion of the integrated circuit, and the second portion of the integrated circuit is configured to encode the output signal with at least one of the effective capacitance or the RC time constant. Depending on the embodiment, the integrated circuit can be represented by one of the circuits 100, 200, 300, 400 described herein with respect to FIGS. 1 through 4.

At operation 1204, a controller (e.g., 120) receives the output signal, where the controller is coupled to the second portion of the integrated circuit. For some embodiments, the controller represents a component or a circuit that is external to the integrated circuit.

At operation 1206, the controller (e.g., 120) determines at least one of the effective capacitance of the first portion of the integrated circuit based on the output signal received by operation 1204, or determines the resistance-capacitance time constant for the first portion of the integrated circuit based on the received output signal received by operation 1204. For some embodiments, the controller determines the effective capacitance of the first portion of the integrated circuit based on the received output signal by: measuring the received output signal (e.g., measuring the period of the received output signal); and determining the effective capacitance of the first portion of the integrated circuit based on the measuring of the received output signal. Additionally, for some embodiments, the controller determines the resistance-capacitance time constant for the first portion of the integrated circuit based on the received output signal by: comparing the received output signal to a reference clock signal that has a known frequency; and determining the resistance-capacitance time constant for the first portion of the integrated circuit based on the comparing of the received output signal to the reference clock signal.

Figure 13:
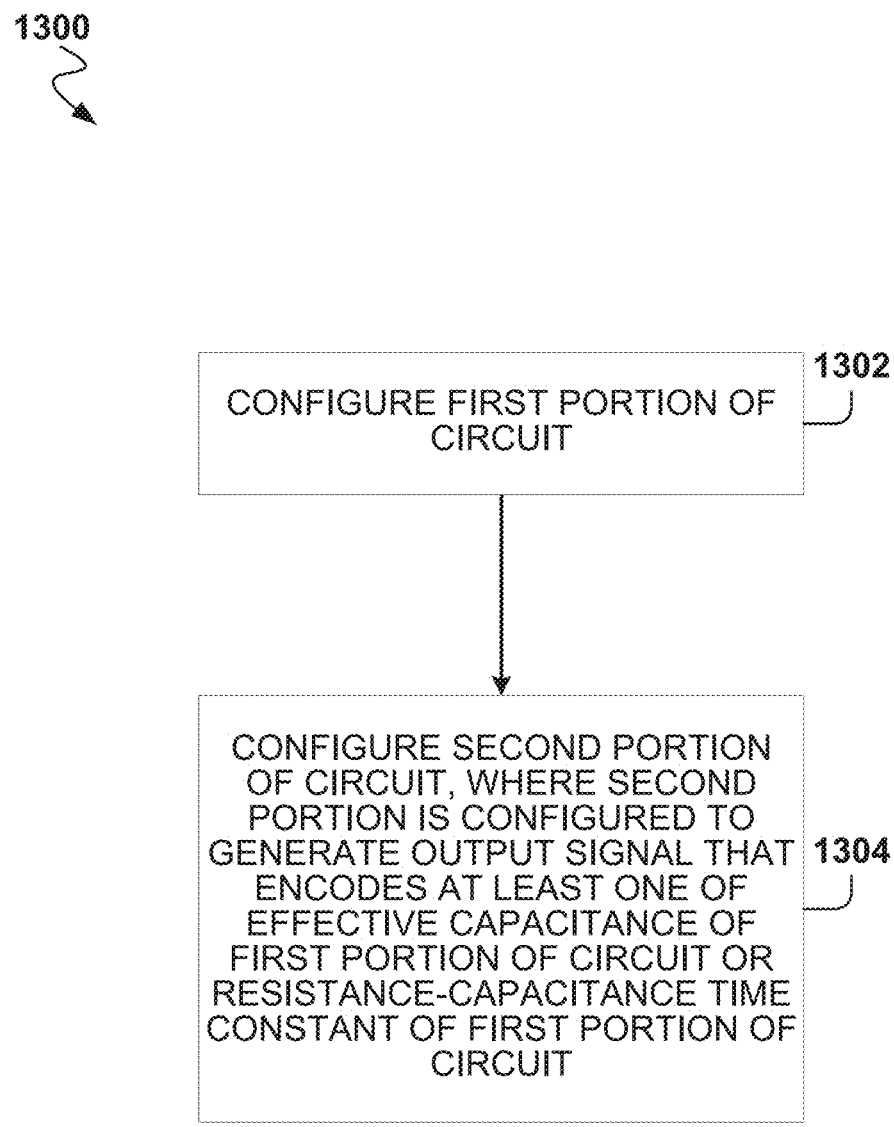
FIG. 13 is a flowchart illustrating an example method for generating a circuit design including a circuit that comprises a portion for determining an effective capacitance, determining a RC time constant, or both for another portion of the circuit, in accordance with some embodiments.

FIG. 13 is a flowchart illustrating an example method 1300 for generating a circuit design including a circuit that comprises a portion for determining an effective capacitance, determining a RC time constant, or both for another portion of the circuit, in accordance with some embodiments. It will be understood that the method 1300 can be performed by a device, such as a computing device executing instructions of an EDA software system, in accordance with some embodiments. Additionally, the method 1300 herein can be implemented in the form of executable instructions stored on a computer-readable medium or in the form of electronic circuitry. For instance, the operations of the method 1300 may be represented by executable instructions that, when executed by a processor of a computing device, cause the computing device to perform the method 1300. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 13, the method 1300 begins with operation 1302, where a first portion (e.g., the target portion 106) of a circuit (e.g., IC) is configured within a circuit design. For some embodiments, the first portion comprises one or more capacitors, for which at least one of an effective capacitance or RC time constant can be determined by a second portion of the circuit as described herein.

At operation 1304, the second portion of the circuit (e.g., IC) is configured within the circuit design, where the second portion is configured to generate an output signal that encodes at least one of the effective capacitance of the first portion of the circuit or the RC time constant of the first portion of the circuit. For various embodiments, the second portion of the circuit is coupled to the first portion of the circuit. Additionally, for some embodiments, the second portion comprises: an operational amplifier (e.g., 110) that comprises a negative input, a positive input, and an operational amplifier output, where the positive input is coupled to a reference voltage (e.g., VREF); a current generator (e.g., 102) that comprises an output coupled to the negative input; a capacitor (e.g.; 104) coupled between the operational amplifier output and the negative input of the operational amplifier; a comparator (e.g., 112) coupled to the operational amplifier output; an amplifier (e.g., 114) coupled to an output of the comparator; a pulse generator (e.g., 116) coupled to an output of the amplifier, where the pulse generator is configured to generate (and output) the output signal; a clock generator (e.g., 118) coupled to an output of the pulse generator; and a switch (e.g., 140) coupled between the negative input and the first portion of the circuit, where the switch is enabled or disabled based on a clock signal generated by the clock generator.

Depending on the embodiment, the method 1300 can implement within a circuit design one of the circuits 100, 200, 300, or 400 as described herein with respect to FIGS. 1 through 4.

Figure 14:
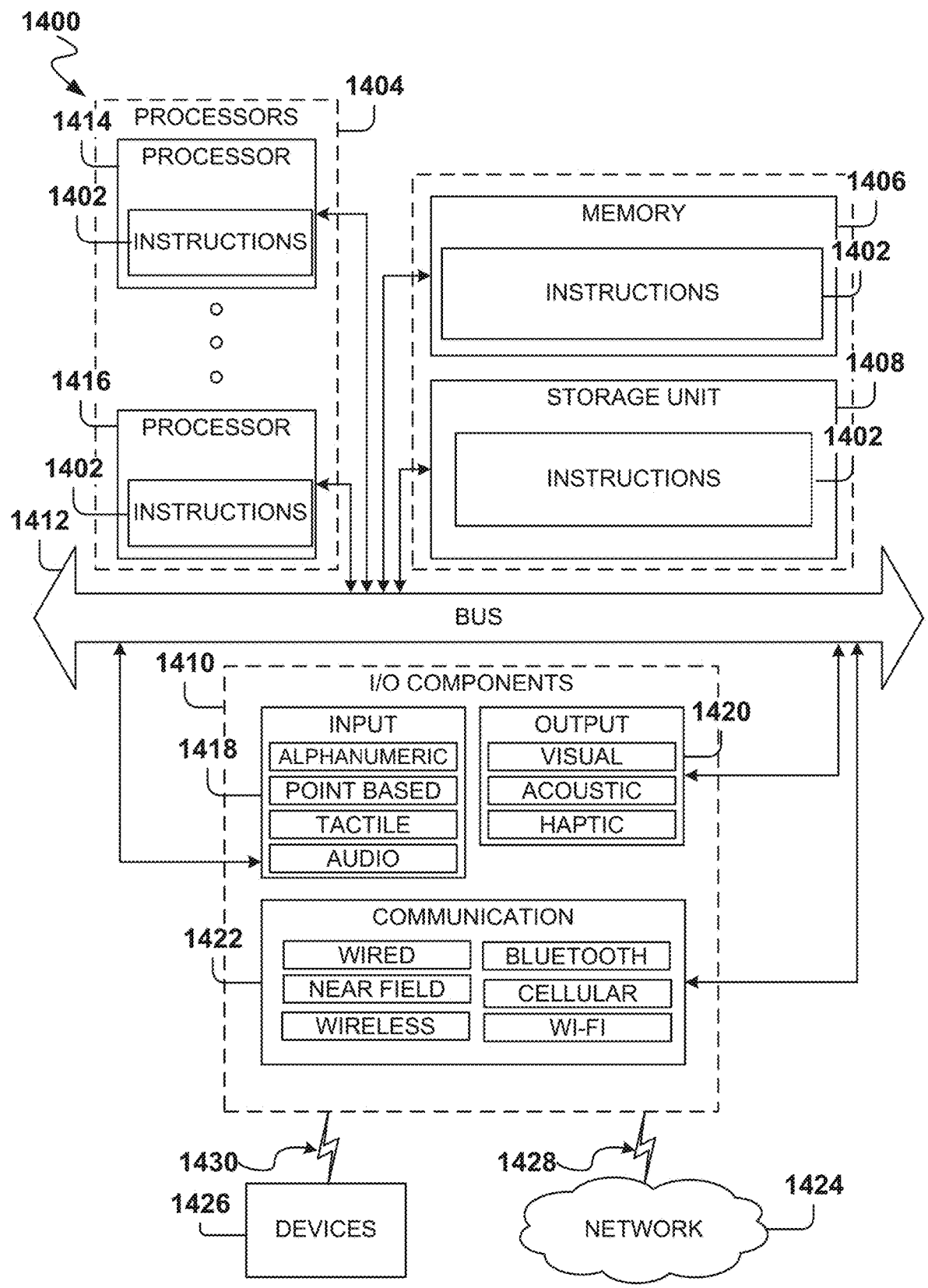
FIG. 14 is a block diagram illustrating components of a machine, according to some example embodiments, able to read instructions from a machine-readable medium and perform any one or more of the methodologies discussed herein.

FIG. 14 is a block diagram illustrating components of a machine 1400, according to some example embodiments, able to read instructions from a machine-readable medium (e.g., a machine-readable storage medium) and perform any one or more of the methodologies discussed herein. Specifically, FIG. 14 shows a diagrammatic representation of the machine 1400 in the example form of a system within which instructions 1402 (e.g., software, a program, an application, an applet, an app, a driver, or other executable code) for causing the machine 1400 to perform any one or more of the methodologies discussed herein may be executed. For example, the instructions 1402 include executable code that causes the machine 1400 to execute the method 1300 described with respect to FIG. 13. In this way, these instructions 1402 transform the general, non-programmed machine 1400 into a particular machine programmed to carry out the described and illustrated method 1300 in the manner described herein. The machine 1400 may operate as a standalone device or may be coupled (e.g., networked) to other machines.

By way of non-limiting example, the machine 1400 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 1402, sequentially or otherwise, that specify actions to be taken by the machine 1400. Further, while only a single machine 1400 is illustrated, the term "machine" shall also be taken to include a collection of machines 1100 that individually or jointly execute the instructions 1402 to perform any one or more of the methodologies discussed herein.

The machine 1400 may include processors 1404, memory 1406, a storage unit 1408, and I/O components 1410, which may be configured to communicate with each other such as via a bus 1412. In an example embodiment, the processors 1404 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 1414 and a processor 1416 that may execute the instructions 1402. The term "processor" is intended to include multi-core processors 1404 that may comprise two or more independent processors (sometimes referred to as "cores") that may execute instructions 1402 contemporaneously. Although FIG. 14 shows multiple processors 1404, the machine 1400 may include a single processor with a single core, a single processor with multiple cores (e.g., a multi-core processor), multiple processors with a single core, multiple processors with multiple cores, or any combination thereof.

The memory 1406 (e.g., a main memory or other memory storage) and the storage unit 1408 are both accessible to the processors 1404 such as via the bus 1412. The memory 1406 and the storage unit 1408 store the instructions 1402 embodying any one or more of the methodologies or functions described herein. The instructions 1402 may also reside, completely or partially, within the memory 1406, within the storage unit 1408, within at least one of the processors 1404 (e.g., within the processor's cache memory), or any suitable combination thereof, during execution thereof by the machine 1400. Accordingly, the memory 1406, the storage unit 1408, and the memory of the processors 1404 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 1402, The term "machine-readable medium" shall also be taken to include any medium, or combination of multiple media, that is capable of storing instructions (e.g., instructions 1402) for execution by a machine (e.g., machine 1400), such that the instructions, when executed by one or more processors of the machine (e.g., processors 1404), cause the machine to perform any one or more of the methodologies described herein (e.g., method 1300). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 1410 may include a wide variety of components to receive input, provide output, produce output, transmit information, exchange information, capture measurements, and so on. The specific I/O components 1410 that are included in a particular machine 1400 will depend on the type of the machine 1400. For example, portable machines such as mobile phones will likely include a touch input device or other such input mechanisms, while a headless server machine will likely not include such a touch input device. It will be appreciated that the I/O components 1410 may include many other components that are not specifically shown in FIG. 14. The I/O components 1410 are grouped according to functionality merely for simplifying the following discussion and the grouping is in no way limiting. In various example embodiments, the I/O components 1410 may include input components 1418 and output components 1420. The input components 1418 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 1420 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 1410 may include communication components 1422 operable to couple the machine 1400 to a network 1424 or devices 1426 via a coupling 1428 and a coupling 1430 respectively. For example, the communication components 1422 may include a network interface component or another suitable device to interface with the network 1424. In further examples, the communication components 1422 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 1426 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 15:
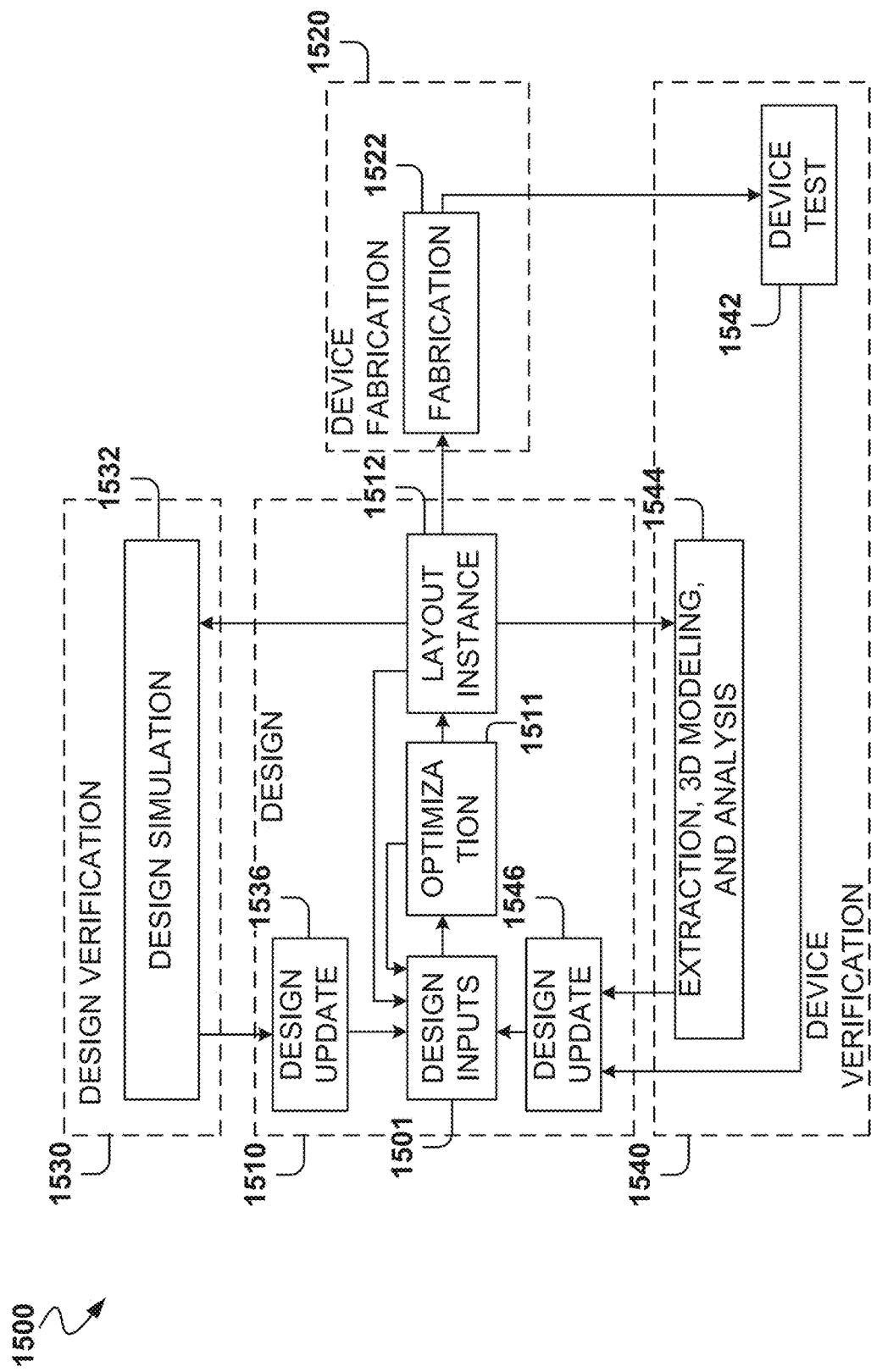
FIG. 15 is a diagram illustrating one possible design process flow for generating a circuit, including embodiments to implement a portion of the circuit that determines an effective capacitance and a RC time constant of another portion of the circuit as described herein, and in various embodiments, to integrate the circuit with a larger circuit.

FIG. 15 is a diagram illustrating one possible design process flow for generating a circuit, including embodiments to implement a portion of the circuit that determines an effective capacitance and a RC time constant of another (target) portion (e.g., 106) of the circuit as described herein, and in various embodiments, to integrate the circuit with a larger circuit. As illustrated, the overall design flow 1500 includes a design phase 1510, a device fabrication phase 1520, a design verification phase 1530, and a device verification phase 1540. The design phase 1510 involves an initial design input operation 1501 where the basic elements and functionality of a device are determined, as well as revisions based on various analyses and optimization of a circuit design. This design input operation 1501 is where instances of an EDA circuit design file are used in the design and any additional circuitry is selected. The initial strategy, tactics, and context for the device to be created are also generated in the design input operation 1501, depending on the particular design algorithm to be used.

In some embodiments, following an initial selection of design values in the design input operation 1501, timing analysis and optimization according to various embodiments occurs in an optimization operation 1511, along with any other automated design processes. One such process may be the automated design of a partitioned root search for error locator polynomial functions in RS FEC decoding. As described below, design constraints for blocks of a circuit design generated with design inputs in the design input operation 1501 may be analyzed using hierarchical timing analysis, according to various embodiments. While the design flow 1500 shows such optimization occurring prior to a layout instance 1512, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1522.

After design inputs are used in the design input operation 1501 to generate a circuit layout, and any optimization operations 1511 are performed, a layout is generated in the layout instance 1512. The layout describes the physical layout dimensions of the device that match the design inputs. This layout may then be used in the device fabrication operation 1522 to generate a device, or additional testing and design updates may be performed using designer inputs or automated updates based on design simulation 1532 operations or extraction, 3D modeling, and analysis 1544 operations. Once the device is generated, the device can be tested as part of device test 1542 operations, and layout modifications generated based on actual device performance.

As described in more detail below, design updates 1536 from the design simulation 1532, design updates 1546 from the device test 1542, the extraction, 3D modeling, and analysis 1544 operations, or the design input operation 1501 may occur after an initial layout instance 1512 is generated. In various embodiments, whenever design inputs are used to update or change an aspect of a circuit design, a timing analysis and optimization operation 1511 may be performed.

For example, in various embodiments, a user may provide an input to a computing device indicating placement of elements of a circuit within a first portion (e.g., 106) of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
   a first portion of an integrated circuit; and
   a second portion of the integrated circuit, the second portion of the integrated circuit comprising:
      an operational amplifier comprising a negative input, a positive input, and an operational amplifier output, the positive input being coupled to a reference voltage;
      a first current generator comprising an output that is coupled to the negative input;
      a first capacitor coupled between the operational amplifier output and the negative input;
      a comparator coupled to the operational amplifier output;
      an amplifier coupled to an output of the comparator;
      a pulse generator coupled to an output of the amplifier, the pulse generator being configured to generate an output signal;
      a clock generator coupled to an output of the pulse generator; and
      a first switch coupled between the negative input and the first portion of the integrated circuit, the first switch being enabled or disabled based on a first clock signal generated by the clock generator.

2. The circuit of claim 1, wherein the output signal generated by the pulse generator encodes at least one of an effective capacitance of the first portion of the integrated circuit or a resistance-capacitance time constant for the first portion of the integrated circuit.

3. The circuit of claim 1, further comprising:
   a controller coupled to the output of the pulse generator, the controller being configured to perform operations comprising:
      measuring the output signal provided by the output of the pulse generator; and
      determining an effective capacitance of the first portion of the integrated circuit based on the measuring the output signal.

4. The circuit of claim 3, wherein the determining the effective capacitance of the first portion of the integrated circuit is further based on a known resistor value.

5. The circuit of claim 4, wherein the operations further comprise:
   prior to the determining the effective capacitance of the first portion of the integrated circuit, causing a resistor value of the first current generator to match a resistor being used by the controller, the resistor being external to the integrated circuit and having the known resistor value.

6. The circuit of claim 3, wherein the measuring the output signal comprises measuring a period of the output signal.

7. The circuit of claim 1, further comprising:
   a controller coupled to the output of the pulse generator, the controller being configured to perform operations comprising:
      comparing the output signal to a reference clock signal that has a known frequency; and
      determining a resistance-capacitance time constant for the first portion of the integrated circuit based on the comparing the output signal to the reference clock signal.

8. The circuit of claim 1, wherein the second portion of the integrated circuit further comprises:
   a second current generator, an input of the second current generator being coupled to the operational amplifier output.

9. The circuit of claim 1, wherein the second portion of the integrated circuit further comprises:
   a resistor coupled between the first capacitor and the negative input.

10. The circuit of claim 1, wherein the second portion of the integrated circuit further comprises:
    a resistor coupled to the negative input; and
    a second capacitor coupled between the resistor and ground.

11. The circuit of claim 1, wherein the comparator is configured to generate a signal based on comparing a reference voltage level to a signal provided by the operational amplifier output.

12. The circuit of claim 1, wherein the clock generator comprises a non-overlapping clock generator.

13. The circuit of claim 1, wherein the second portion further comprises:
    a second switch coupled between the first portion of the integrated circuit and ground.

14. The circuit of claim 13, wherein the second switch is enabled or disabled based on a second clock signal generated by the clock generator, and wherein the first switch is enabled or disabled based on the first clock signal and the second switch is enabled or disabled based on the second clock signal such that the first switch and the second switch are not enabled at a same time.

15. The circuit of claim 14, wherein the first clock signal and the second clock signal are non-overlapping.

16. The circuit of claim 13, wherein the second switch is enabled or disabled based on the first clock signal generated by the clock generator.

17. A non-transitory computer-readable medium comprising instructions that, when executed by one or more processors of a computing device, cause the computing device to generate a circuit design by performing operations comprising:

configuring, in a circuit design, a first portion of a circuit; and configuring, in the circuit design, a second portion of the circuit configured to generate an output signal that encodes at least one of an effective capacitance of the first portion of the circuit or a resistance-capacitance time constant for the first portion of the circuit, the second portion of the circuit comprising:

an operational amplifier comprising a negative input, a positive input, and an operational amplifier output, the positive input being coupled to a reference voltage;

a current generator comprising an output that is coupled to the negative input;

a capacitor coupled between the operational amplifier output and the negative input;

a comparator coupled to the operational amplifier output;

an amplifier coupled to an output of the comparator;

a pulse generator coupled to an output of the amplifier, the pulse generator being configured to generate an output signal;

a clock generator coupled to an output of the pulse generator; and a switch coupled between the negative input and the first portion of the circuit, the switch being enabled or disabled based on a clock signal generated by the clock generator.

\* \* \* \* \*